United States Patent
Cvach et al.

(10) Patent No.: US 10,605,820 B2
(45) Date of Patent: Mar. 31, 2020

(54) SHOCK-ISOLATED MOUNTING DEVICE WITH A THERMALLY-CONDUCTIVE LINK

(71) Applicant: Honeywell International Inc., Morris Plains, NJ (US)

(72) Inventors: Petr Cvach, Jihlava (CZ); Tomas Neuzil, Brno (CZ); Jan Scheirich, Stochov (CZ)

(73) Assignee: Honeywell International Inc., Morris Plains, NJ (US)

( * ) Notice: Subject to any disclaimer, the term of this patent is extended or adjusted under 35 U.S.C. 154(b) by 213 days.

(21) Appl. No.: 15/793,571

(22) Filed: Oct. 25, 2017

(65) Prior Publication Data

US 2019/0120870 A1  Apr. 25, 2019

(51) Int. Cl.

| | |
|---|---|
| G01P 1/02 | (2006.01) |
| F16F 15/02 | (2006.01) |
| G01D 11/10 | (2006.01) |
| B81B 7/00 | (2006.01) |
| G01D 11/24 | (2006.01) |
| G01P 1/00 | (2006.01) |
| F16F 15/08 | (2006.01) |
| G01C 21/16 | (2006.01) |
| H05K 7/14 | (2006.01) |
| H05K 7/20 | (2006.01) |
| H05K 5/00 | (2006.01) |

(52) U.S. Cl.
CPC ........... *G01P 1/023* (2013.01); *B81B 7/0016* (2013.01); *F16F 15/022* (2013.01); *F16F 15/08* (2013.01); *G01C 21/16* (2013.01); *G01D 11/10* (2013.01); *G01D 11/245* (2013.01); *G01P 1/003* (2013.01); *H05K 5/0078* (2013.01); *H05K 7/142* (2013.01); *H05K 7/2049* (2013.01)

(58) Field of Classification Search
None
See application file for complete search history.

(56) References Cited

U.S. PATENT DOCUMENTS

| 5,812,374 A | 9/1998 | Shuff |
| 6,049,469 A | 4/2000 | Hood, III et al. |
| 6,953,985 B2 * | 10/2005 | Lin ................. B81B 7/0064 |
| | | 257/659 |

(Continued)

OTHER PUBLICATIONS

European Patent Office, "Extended European Search Report from EP Application No. 18202175.8 dated Feb. 18, 2019", from Foreign Counterpart to U.S. Appl. No. 15/793,571, pp. 1-9, Published: EP.

*Primary Examiner* — Paul M. West
*Assistant Examiner* — Mark A Shabman
(74) *Attorney, Agent, or Firm* — Fogg and Powers LLC

(57) ABSTRACT

A shock-isolated mounting device and a method and system are provided. For example, the shock-isolated mounting device includes an enclosure configured to support the mounting device, at least one damper attached between the mounting device and the enclosure, and a thermally-conductive element disposed on a surface of the mounting device and configured to thermally couple the mounting device to the enclosure. The thermally-conductive element facilitates the dissipation of heat generated by electronic components mounted onto the shock-isolated mounting device.

20 Claims, 5 Drawing Sheets

(56) References Cited

U.S. PATENT DOCUMENTS

| | | | |
|---|---|---|---|
| 7,152,473 B1* | 12/2006 | Rushefsky | B81B 7/0074 73/514.16 |
| 8,322,028 B2 | 12/2012 | Ge et al. | |
| 8,573,056 B1* | 11/2013 | Hollis | G01C 19/5783 73/504.15 |
| 9,069,001 B2 | 6/2015 | Braman et al. | |
| 9,625,284 B2 | 4/2017 | Braman et al. | |
| 9,778,043 B1* | 10/2017 | Johnson | G01S 19/35 |
| 2004/0150144 A1 | 8/2004 | Goepfert et al. | |
| 2008/0117614 A1 | 5/2008 | Qin et al. | |
| 2009/0225522 A1 | 9/2009 | Mori | |
| 2010/0188729 A1* | 7/2010 | Forgey | B81C 1/00333 359/290 |
| 2010/0257932 A1* | 10/2010 | Braman | G01C 21/16 73/493 |
| 2016/0081227 A1* | 3/2016 | Lee | H05K 7/20509 165/185 |
| 2016/0349280 A1 | 12/2016 | Wang et al. | |

\* cited by examiner

SHOCK-ISOLATED MOUNTING DEVICE WITH A THERMALLY-CONDUCTIVE LINK

BACKGROUND

Inertial Measurement Units (IMUs) are devices that can sense the rotation and acceleration of an object. For example, IMUs can be utilized to detect the rate of acceleration and the change in rotational attributes of objects about three axes for a given period of time. In space applications, IMUs are utilized in navigational and guidance systems for launch vehicles, spacecraft, satellites and the like. In other applications, IMUs are utilized to guide (e.g., gun-launched) large caliber projectiles. In any case, during the launch of a spacecraft, satellite or large caliber projectile, the electronic components in the onboard IMUs are subjected to the severe shock loads caused by the high accelerations involved.

Nevertheless, in order to conserve power, weight and space in the IMUs and guidance systems involved, Micro-Electro-Mechanical Systems (MEMS) components can be utilized. For example, in space applications, MEMS rate-of-turn sensors are mounted on printed board assemblies (PBAs) in enclosures within the IMUs involved. However, during a launch, these MEMS sensors are subjected to the severe shock loads caused by the high accelerations and the MEMS sensors can fail. Also, these MEMS sensors are subjected to the harsh environmental conditions encountered while in space (e.g., vacuum, temperature extremes) and can fail if a suitable thermal balance is not maintained between the MEMS sensors and the enclosure for the PBA.

For the reasons stated above, and for other reasons stated below, which will become apparent to those skilled in the art upon reading and understanding the specification, there is a need in the art for a way to mount PBAs with MEMS sensors that enables use in harsh environments including severe shock loads and extreme thermal conditions.

SUMMARY

The embodiments of the present invention provide a shock-isolated mounting device with a thermally-conductive link, and will be understood by reading and studying the following specification.

A shock-isolated mounting, method and system are provided. In one embodiment, a shock-isolated mounting includes a mounting device, an enclosure configured to support the mounting device, and at least one damper attached between the mounting device and the enclosure. A thermally-conductive element is disposed on a surface of the mounting device and configured to thermally couple the mounting device to the enclosure.

DRAWINGS

Embodiments of the present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the exemplary embodiments. Reference characters denote like elements throughout the figures and text.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention improve on the prior art by providing an enhanced shock-isolated mounting device for electronic components subjected to the severe shock loads encountered during the launches of vehicles into space, and a thermally-conductive link between the shock-isolated mounting device and an enclosure to dissipate the heat energy generated by the electronic components in the harsh environmental conditions encountered in space.

Figure 1:
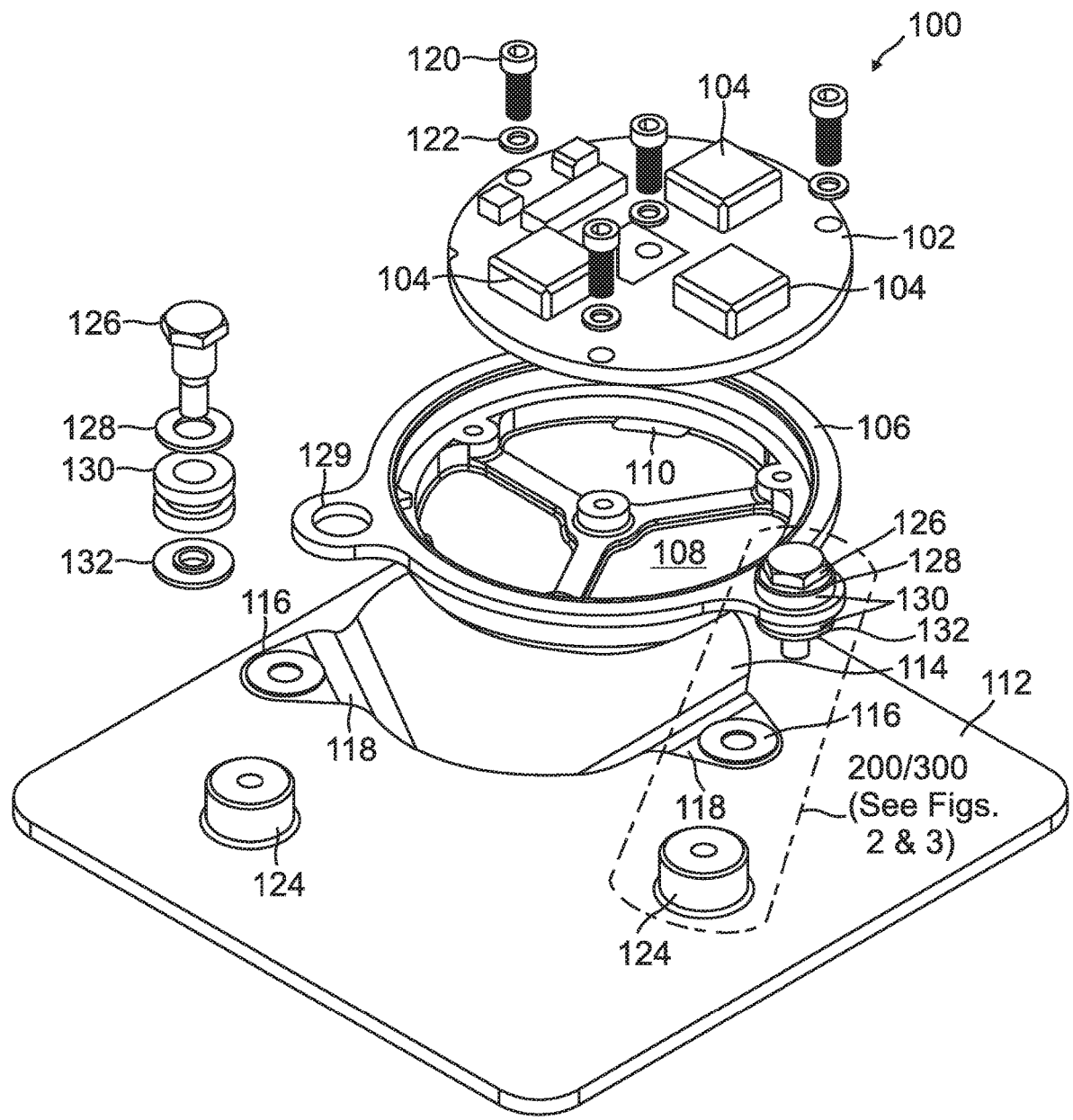
FIG. 1 illustrates a plan view of a mounting device that can be utilized to implement one example embodiment of the present invention.

FIG. 1 illustrates a plan view of a shock-isolated mounting device 100, which can be utilized to implement one example embodiment of the present invention. Referring to FIG. 1, the device 100 includes a printed board assembly (PBA) 102. A plurality of electronic components including, for example, one or more MEMS sensors 104 are mounted on the upper surface of the PBA 102. The device 100 also includes a mounting device or ring 106. For the example embodiment illustrated in FIG. 1, the entire mounting ring 106 including the bottom portion 108 is made of a thermally-conductive material. For example, the thermally-conductive material can be any suitable metal material that can transfer heat energy from the PBA 102 to a thermally-conductive element 114. In one embodiment, one or more venting holes 110 can be formed in the bottom portion 108 to facilitate the equalization of pressure (e.g., during the launch of a spacecraft or large caliber projectile). Device 100 also includes an enclosure 112. For the embodiment illustrated in FIG. 1, the enclosure 112 is made of a suitable metal material that can, for example, dissipate heat energy transferred from the PBA 102. In one embodiment, the enclosure 112 can be utilized to dissipate the heat energy transferred from the PBA 102. In a second embodiment, the enclosure 112 can be utilized to transfer the heat energy from the PBA 102 to another structure that can dissipate the heat energy transferred (e.g., a baseplate or chassis in a launch vehicle, spacecraft or satellite).

For the example embodiment illustrated in FIG. 1, the thermally-conductive element 114 is a thin layer of a flexible, thermally-conductive material (e.g., metal foil) that is fixedly attached (e.g., epoxied or glued) to the external surface of the bottom portion 108. For example, the thermally-conductive element or foil 114 can be a rigid-flex printed circuit board (PCB) with rigid sections 116 that form hard contact surfaces, and flexible sections 118 that enable some movement flexibility between the mounting ring 106 and the enclosure 112. For example, in one embodiment, the thermally-conductive element or foil 114 can be formed with two layers of Kapton and a layer of copper sandwiched between the layers of Kapton. In a second embodiment, the thermally-conductive element or foil 114 can be formed with a single layer of a suitable thermally-conductive material (e.g., aluminum, copper). The adhesive utilized to attach the thermally-conductive element or foil 114 to the bottom portion 108 of the mounting ring 106 can be, for example, an epoxy that has a low thermal resistance and suitable electrical conductivity to ensure the viability of the thermal and electrical bonds between the thermally-conductive element or foil 114 and the bottom portion 108 of the mounting ring 106.

For this example embodiment, the PBA 102 is attached to the mounting ring 106 with four screws (e.g., 120) and four accompanying washers (e.g., 122). The mounting ring 106 is attached to the enclosure 112 via a plurality of mounts 124 disposed on the surface of the enclosure 112. At each mount 124, a damper 130 (e.g., made of very high density silicon rubber) is inserted into a mounting hole 129 in the mounting ring 106. A shoulder bolt 126 can be inserted through a washer 128, the damper 130 in the mounting hole 129, a second washer 132, and then screwed into the mount 124. For the example embodiment illustrated in FIG. 1, the tightening of the shoulder bolt 126 compresses the damper 130 until the shoulder of the shoulder bolt 126 contacts the lipped upper surface of the second washer 132. In this way, the amount of the pre-load compression of the damper 130 is selectable and can be determined by the length of the shoulder of the shoulder bolt 126. In any event, the hard contact surface 116 of the foil 114 is pressed between the second washer 132 and the mount 124, and thus a suitable level of contact pressure is maintained between the hard contact surface 116 and the enclosure 112 (e.g., independently of the amount of the pre-load compression of the damper 130). Note that, in order to facilitate ease of understanding, the inset 200/300 depicted in FIG. 1 illustrates where corresponding views of the shock-isolated mounting ring 106, damper 130 and thermally-conductive element 116/118 are shown in assembled form in FIGS. 2 and 3, as described in detail below.

Figure 2:
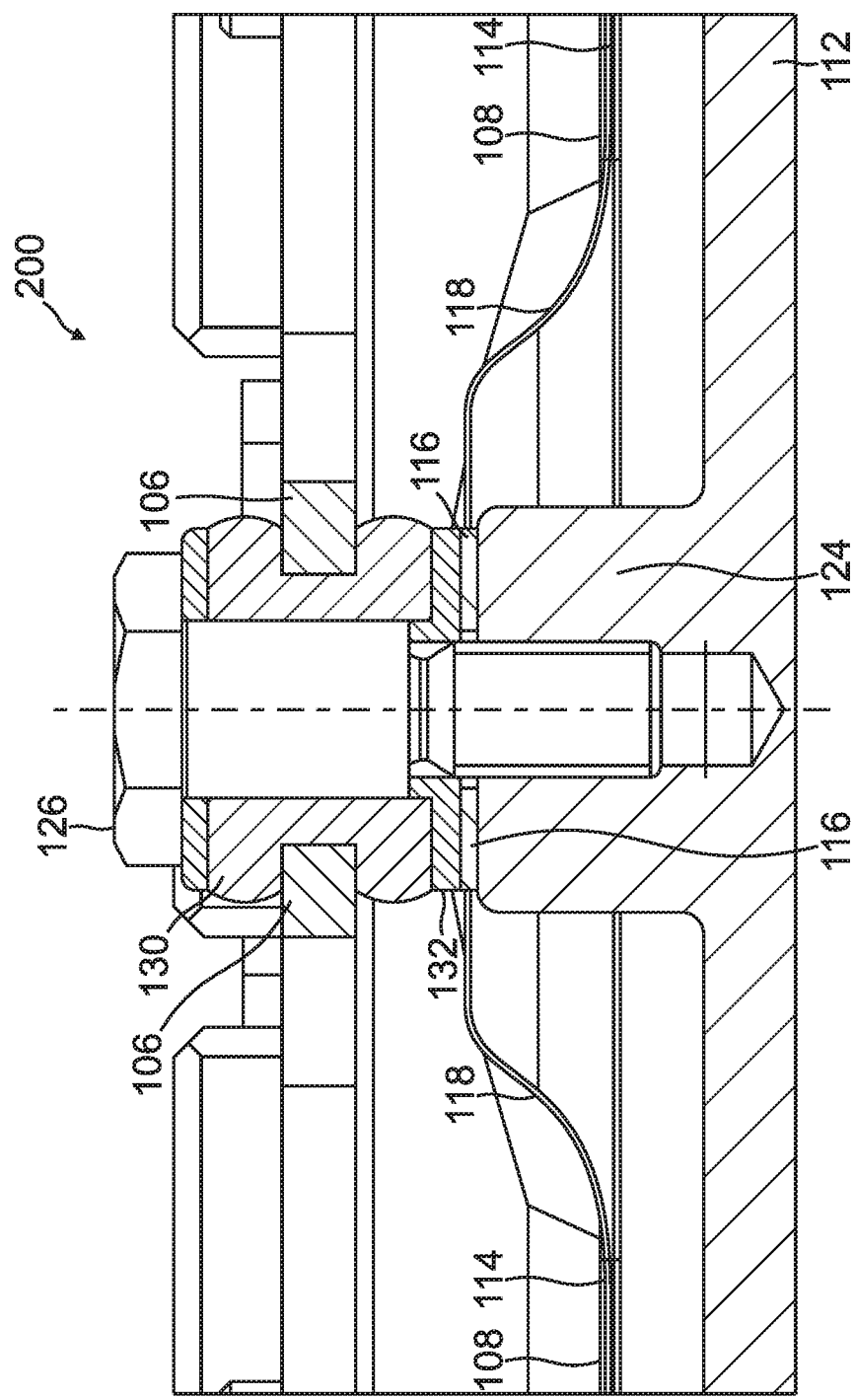
FIG. 2 illustrates an enhanced cross-sectional, side view of one aspect of the example embodiment illustrated in FIG. 1.

FIG. 2 illustrates an enhanced cross-sectional, side view 200 of one aspect of the example embodiment illustrated in FIG. 1. Referring to FIG. 2, the shoulder bolt 126 is shown inserted through the damper 130, which in turn is inserted in the mounting hole 129 of the mounting ring 106. The shoulder bolt 126 is further inserted through the second washer 132 and the hard contact surface 116 of the foil 114, and screwed into the mount 124 disposed on the enclosure 112. The foil 114 is affixed to the bottom 108 of the mounting ring 106. Notably, the dampers 130 are configured to absorb a substantial amount of the shock loads that result from the high accelerations encountered during launches of the vehicles involved, which significantly reduces the failure rates of the electronic components (e.g., MEMS sensors) mounted on the PBAs 102. Also, the foil 114 is configured to thermally link the PBA 102 with the enclosure 112, which facilitates the transfer of heat between the PBA 102 and enclosure 112 and thus enhances the thermal balance between the electronic components (e.g., MEMS sensors) and the enclosure/chassis of the system (e.g., IMU) involved.

Figure 3:
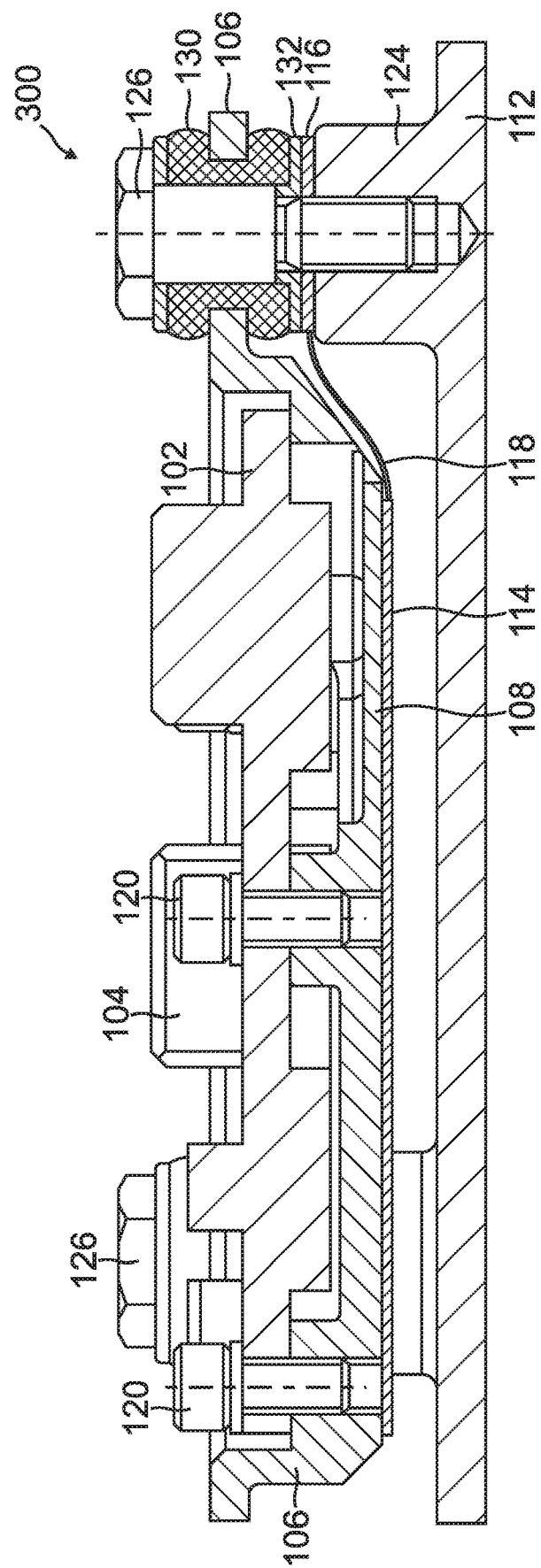
FIG. 3 illustrates a cross-sectional, side view of the mounting device depicted in FIG. 1.

FIG. 3 illustrates a cross-sectional, side view 300 of the device 100 depicted in FIG. 1. Notably, the unassembled device 100 illustrated in FIG. 1 is depicted as an assembled device 300 in FIG. 3. Referring to FIG. 3, two "tightened" or assembled shoulder bolts 126 are shown. For example, the right-most shoulder bolt 126 is shown inserted through the damper 130, which is inserted in the mounting hole of the mounting ring 106. The shoulder bolt 126 is further inserted through the second washer 132 and the hard contact surface 116 of the foil 114, and screwed into the mount 124 disposed on the enclosure 112. The thermally-conductive element or foil 114 is affixed to the bottom 108 of the mounting ring 106. Screws 120 are utilized to mount the PBA 102 onto the mounting ring 106, and one or more MEMS sensors 104 are mounted on the PBA 102. As described above with respect to FIGS. 1-3, the thermally-conductive element or foil 114 is configured to thermally link the PBA 102 with the enclosure 112, which facilitates the transfer of heat between the PBA 102 and enclosure 112 and thus enhances the thermal balance between the electronic components (e.g., MEMS sensors 104) and the enclosure/chassis of the system (e.g., IMU) involved.

Figure 4:
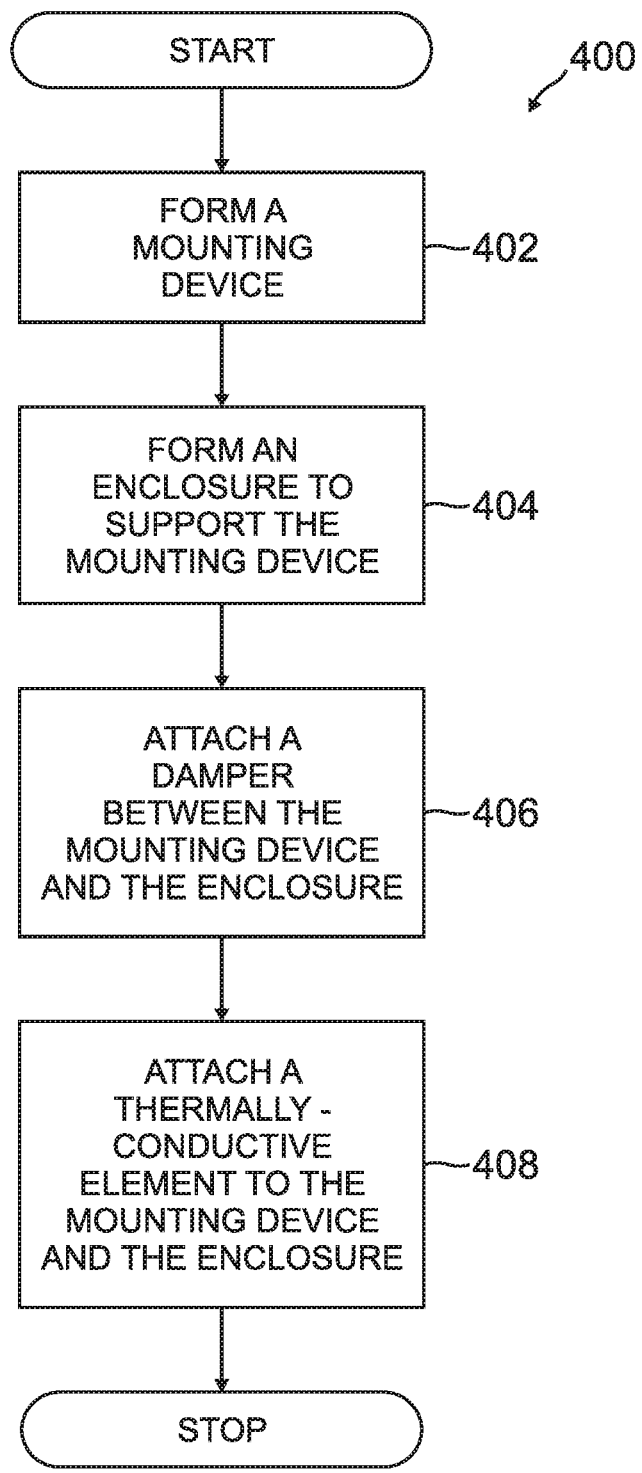
FIG. 4 illustrates a method that can be utilized to implement one example embodiment of the present invention.

FIG. 4 illustrates a method 400, which can be utilized to implement one example embodiment of the present invention. For example, the method 400 can be utilized to implement the exemplary device 100 illustrated in FIG. 1. As such, referring to FIGS. 1 and 4, the method 400 begins by forming or otherwise providing a mounting device (402). For this example embodiment, the mounting device is the mounting ring 106 illustrated in FIG. 1. An enclosure is formed or otherwise provided to support the mounting device (404). For this embodiment, a portion of the enclosure thus formed is the enclosure/chassis section 112 depicted in FIG. 1. A shock-isolating damper (e.g., damper 130 in FIG. 1) is attached between the mounting device and the enclosure (406). Note that although one damper 130 is being described herein with respect to FIG. 4, a plurality of dampers 130 can be attached between the mounting device and the enclosure, as indicated in FIG. 1. A thermally-conductive element is attached to the mounting device and the enclosure (408). For the example embodiment illustrated in FIG. 1, the thermally-conductive element includes the foil 114 affixed to the bottom 108 of the mounting ring 106, and the flexible section 118 and hard contact surface 116 attached between the second washer 132 and the mount 124. The method 400 is then terminated.

Figure 5:
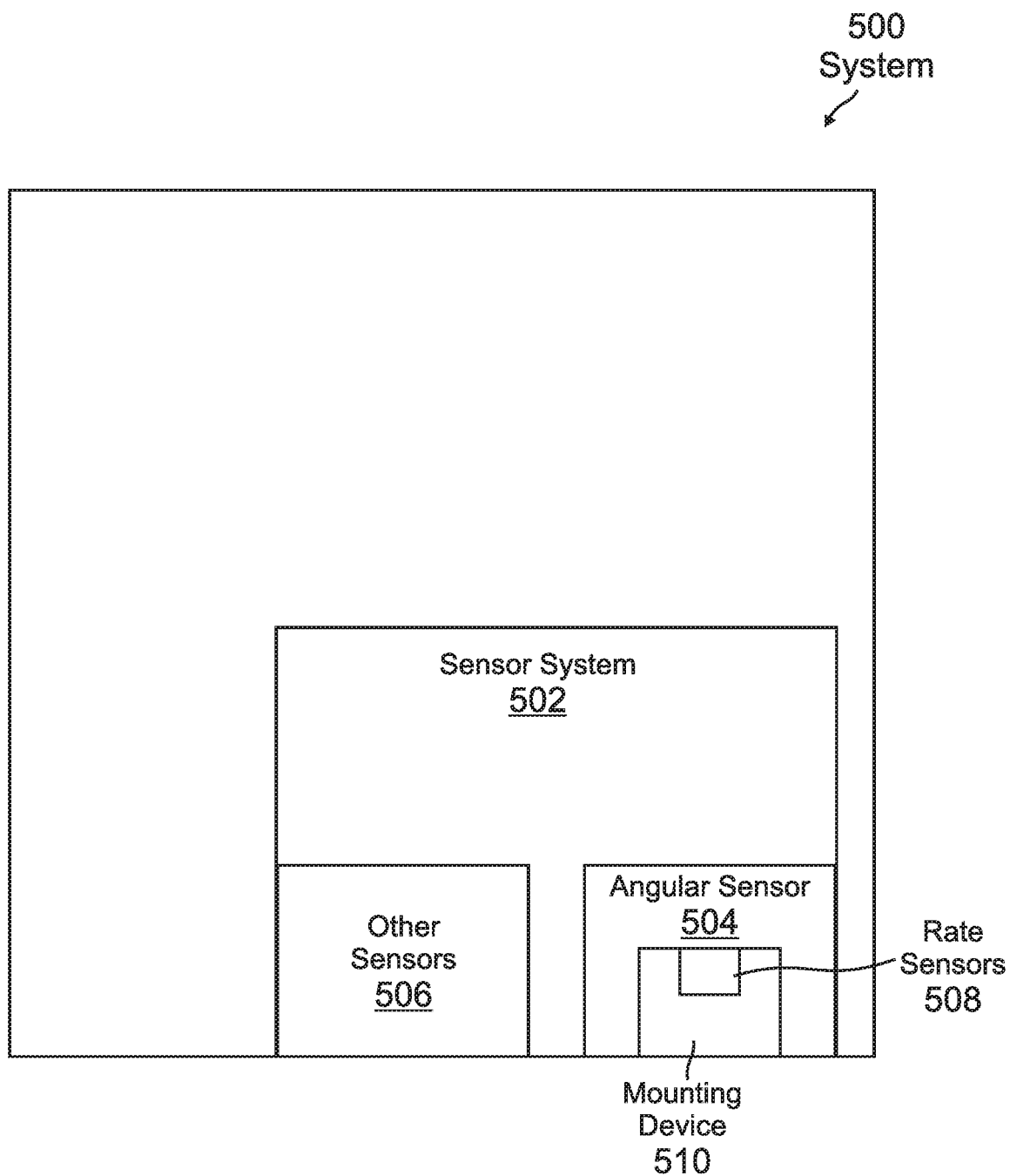
FIG. 5 illustrates a system that can be utilized to implement one example embodiment of the present invention.

FIG. 5 illustrates a simplified, schematic block diagram of a system 500, which can be utilized to implement one example embodiment of the present invention. For this embodiment, the system 500 illustrated in FIG. 5 is a spacecraft, such as, for example, a satellite. In a second embodiment, the system is a guided projectile, such as, for example, a large caliber projectile. Referring to FIG. 5, the exemplary system 500 includes (among other components) a sensor system 502, which, in one embodiment, is a component of a navigational and guidance subsystem for guiding the spacecraft shown. The sensor system 502 includes (among other components) an angular sensor 504, and a plurality of other sensors 506 that also function, in one embodiment, to guide the spacecraft shown. The angular sensor 504 includes a plurality of rate sensors 508. The plurality of rate sensors 508 includes (e.g., among other components) a plurality of MEMS rate sensors (e.g., MEMS sensors 104 in FIG. 1). The MEMS rate sensors (e.g., 104 in FIG. 1) are mounted onto a PBA (e.g., PBA 102 in FIG. 1), and the PBA is attached to a shock-isolated mounting device 510 (e.g., attached to the mounting ring 106 of the shock-isolated mounting device 100 in FIG. 1). As such, for this exemplary embodiment, the system 500 provides a shock-isolated mounting for the plurality of MEMS rate sensors (and other components) mounted onto the PBA, and a thermally-conductive link to facilitate dissipating the heat generated by the plurality of MEMS rate sensors.

EXAMPLE EMBODIMENTS

Example 1 includes a shock-isolated mounting, comprising: a mounting device; an enclosure configured to support the mounting device; at least one damper attached between the mounting device and the enclosure; and a thermally-conductive element disposed on a surface of the mounting device and configured to thermally couple the mounting device to the enclosure.

Example 2 includes the shock-isolated mounting of Example 1, further comprising a printed board assembly (PBA) attached to the mounting device.

Example 3 includes the shock-isolated mounting of any of Examples 1-2, further comprising a PBA attached to the mounting device, and at least one electronic component mounted to the PBA.

Example 4 includes the shock-isolated mounting of any of Examples 1-3, further comprising a PBA attached to the mounting device, and a plurality of Micro-Electro-Mechanical Systems (MEMS) sensors mounted to the PBA.

Example 5 includes the shock-isolated mounting of any of Examples 1-4, wherein the mounting device comprises a mounting ring.

Example 6 includes the shock-isolated mounting of any of Examples 1-5, wherein the thermally-conductive element comprises a single layer of a thermally-conductive material.

Example 7 includes the shock-isolated mounting of any of Examples 1-6, wherein the thermally-conductive element comprises a first layer made of Kapton, a second layer made of copper, and a third layer made of Kapton.

Example 8 includes the shock-isolated mounting of any of Examples 1-7, wherein the at least one damper comprises a silicon rubber damper.

Example 9 includes the shock-isolated mounting of any of Examples 1-8, wherein the mounting device is attached to the enclosure with a plurality of shoulder bolts.

Example 10 includes the shock-isolated mounting of any of Examples 1-9, wherein the mounting device is attached to the enclosure with at least one shoulder bolt, and a length of a shoulder of the at least one shoulder bolt is associated with an amount that the at least one damper is compressed by the attachment of the shoulder bolt.

Example 11 includes a method, comprising: providing a mounting device; providing an enclosure to support the mounting device; attaching a damper between the mounting device and the enclosure; and attaching a thermally-conductive element to the mounting device and the enclosure.

Example 12 includes the method of Example 11, wherein the providing the mounting device comprises forming a metal mounting ring.

Example 13 includes the method of any of Examples 11-12, further comprising compressing the damper to preload the damper by a predefined amount.

Example 14 includes the method of any of Examples 11-13, wherein the attaching the damper comprises disposing a silicon rubber damper between a mounting ring and a mount disposed on the enclosure.

Example 15 includes the shock-isolation method of any of Examples 11-14, wherein the attaching the thermally-conductive element comprises attaching a layer of a metal material to a surface of the mounting device and a component of the enclosure.

Example 16 includes a system, comprising: a sensor system; an angular sensor in the sensor system; a plurality of rate sensors in the angular sensor; a mounting device including the plurality of rate sensors; an enclosure configured to support the mounting device; at least one damper attached between the mounting device and the enclosure; and a thermally-conductive element disposed on a surface of the mounting device and configured to thermally couple the mounting device to the enclosure.

Example 17 includes the system of Example 16, wherein the sensor system is a subsystem of a navigational and guidance system configured to guide a vehicle during or after a launch of the vehicle.

Example 18 includes the system of any of Examples 16-17, wherein the system comprises a spacecraft.

Example 19 includes the system of any of Examples 16-18, wherein the plurality of rate sensors comprises a plurality of MEMS rate sensors.

Example 20 includes the system of any of Examples 16-19, wherein the sensor system is a subsystem of a guided projectile.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A shock-isolated mounting, comprising:
   a mounting device configured for mounting electronic components;
   an enclosure configured to support the mounting device;
   at least one damper attached between the mounting device and the enclosure and configured for elastically supporting the mounting device; and
   a thermally-conductive element comprising at least a flexible section, at least a rigid section supported by the enclosure, and a surface disposed on a portion of the mounting device and configured to thermally couple the mounting device to the enclosure, wherein the flexible section joins the rigid section to the surface.

2. The shock-isolated mounting of claim 1, further comprising a printed board assembly (PBA) attached to the mounting device.

3. The shock-isolated mounting of claim 1, further comprising a PBA attached to the mounting device, and at least one electronic component mounted to the PBA.

4. The shock-isolated mounting of claim 1, further comprising a PBA attached to the mounting device, and a plurality of Micro-Electro-Mechanical Systems (MEMS) sensors mounted to the PBA.

5. The shock-isolated mounting of claim 1, wherein the mounting device comprises a mounting ring.

6. The shock-isolated mounting of claim 1, wherein the thermally-conductive element comprises a single layer of a thermally-conductive material.

7. The shock-isolated mounting of claim 1, wherein the thermally-conductive element comprises a first layer made of Kapton, a second layer made of copper, and a third layer made of Kapton.

8. The shock-isolated mounting of claim 1, wherein the at least one damper comprises a silicon rubber damper.

9. The shock-isolated mounting of claim 1, wherein the mounting device is attached to the enclosure with a plurality of shoulder bolts.

10. The shock-isolated mounting of claim 1, wherein the mounting device is attached to the enclosure with at least one shoulder bolt, and a length of a shoulder of the at least one shoulder bolt is equal to the length of the at least one damper when compressed by the attachment of the shoulder bolt.

11. A method, comprising:
providing a mounting device configured for mounting electronic components;
providing an enclosure to support the mounting device;
attaching a damper between the mounting device and the enclosure, wherein the damper elastically supports the mounting device; and
attaching a surface of a thermally-conductive element to a portion of the mounting device and a rigid section of the thermally-conductive element to the enclosure, wherein a flexible section of the thermally-conductive element joins the rigid section to the surface.

12. The method of claim 11, wherein the providing the mounting device comprises forming a metal mounting ring.

13. The method of claim 11, further comprising compressing the damper to preload the damper by a predefined amount.

14. The method of claim 11, wherein the attaching the damper comprises disposing a silicon rubber damper between a mounting ring and a mount disposed on the enclosure.

15. The shock-isolation method of claim 11, wherein the attaching the surface of the thermally-conductive element comprises attaching a layer of a metal material to a portion of the mounting device.

16. A system, comprising:
a sensor system;
an angular sensor in the sensor system;
a plurality of rate sensors in the angular sensor;
a mounting device configured for mounting electronic components including the plurality of rate sensors;
an enclosure configured to support the mounting device;
at least one damper attached between the mounting device and the enclosure and configured for elastically supporting the mounting device; and
a thermally-conductive element comprising at least a flexible section, at least a rigid section supported by the enclosure, and a surface disposed on a portion of the mounting device and configured to thermally couple the mounting device to the enclosure, wherein the flexible section joins the rigid section to the surface.

17. The system of claim 16, wherein the sensor system is a subsystem of a navigational and guidance system configured to guide a vehicle during or after a launch of the vehicle.

18. The system of claim 16, wherein the system comprises a spacecraft.

19. The system of claim 16, wherein the plurality of rate sensors comprises a plurality of MEMS rate sensors.

20. The system of claim 16, wherein the sensor system is a subsystem of a guided projectile.

* * * * *